United States Patent
Chung

(10) Patent No.: US 6,184,106 B1
(45) Date of Patent: Feb. 6, 2001

(54) METHOD FOR MANUFACTURING A SEMICONDUCTOR DEVICE

(75) Inventor: Myung Jun Chung, Kyoungkido (KR)

(73) Assignee: Hyundai Electronics Industries Co., Ltd., Ichon-shi (KR)

( * ) Notice: Under 35 U.S.C. 154(b), the term of this patent shall be extended for 0 days.

(21) Appl. No.: 09/157,472

(22) Filed: Sep. 21, 1998

Related U.S. Application Data

(62) Division of application No. 08/837,341, filed on Apr. 17, 1997, now abandoned.

(30) Foreign Application Priority Data

Jun. 27, 1996 (KR) ................................................ 96-24666

(51) Int. Cl.⁷ ................................................ H01L 21/76
(52) U.S. Cl. ........................ 438/425; 438/439; 438/444
(58) Field of Search ..................... 438/425, 439, 438/444

(56) References Cited

U.S. PATENT DOCUMENTS

| | | | |
|---|---|---|---|
| 4,888,820 | * 12/1989 | Chen et al. ........................... | 361/313 |
| 4,959,696 | * 9/1990 | Frensley et al. ...................... | 257/15 |
| 5,250,836 | * 10/1993 | Miura et al. .......................... | 257/374 |
| 5,306,940 | * 4/1994 | Yamazaki ............................. | 257/374 |
| 5,350,941 | * 9/1994 | Madan .................................. | 257/510 |
| 5,521,422 | * 5/1996 | Mandelman et al. ................. | 257/510 |
| 5,612,567 | * 3/1997 | Baliga .................................. | 257/510 |
| 5,675,173 | * 10/1997 | Kawai et al. ......................... | 257/510 |
| 5,888,881 | * 3/1999 | Jeng et al. . | |
| 5,915,191 | * 6/1999 | Jun . | |
| 6,103,595 | * 8/2000 | Jeng . | |

FOREIGN PATENT DOCUMENTS

| | | | |
|---|---|---|---|
| 401189173 | * 7/1989 | (JP) ...................................... | 257/510 |
| 3-3346 | 1/1991 | (JP) . | |

* cited by examiner

*Primary Examiner*—John F. Niebling
*Assistant Examiner*—Josetta Jones
(74) *Attorney, Agent, or Firm*—Jacobson, Price, Holman & Stern, PLLC

(57) ABSTRACT

The present invention provides a method of forming an isolation region comprising a trench isolation region involved in a semiconductor device. A silicon oxide film is grown on a surface of a trench groove formed within a semiconductor substrate, followed by a deposition of a nitride film material. An oxide film is formed on the silicon oxide film of the wide trench groove region. The nitride film within the trench groove region, so as to form a device isolation film is etched, sequentially, a oxide film is deposited on the entire exposed surface of the trench region, and the oxide film except within the trench groove, is etched by using chemical mechanical polishing (CMP).

5 Claims, 5 Drawing Sheets

METHOD FOR MANUFACTURING A SEMICONDUCTOR DEVICE

This is a divisional application of application Ser. No. 08/837,341 filed Apr. 17, 1997 now abandoned.

BACKGROUND OF THE INVENTION

1. Field of the Invention

The present invention relates to a method of forming an isolation region involved in a semiconductor device, and more particularly to a method of fabricating a semiconductor device having an isolation region of trench type.

2. Description of the Related Art

As the integration of semiconductor devices increases, the separation area between the devices has been made smaller every generation. A conventional local oxidation of silicon (LOCOS) process for submicron technologies is limited by oxide encroachment, as well as by nonplanar surface topographies and the field-thinning effect. A device separation area of trench type has also been used.

The conventional method of forming a device isolation region of trench type will be explained with reference to FIGS. 1A, 1B and 2.

One of the conventional methods will now be described with FIGS. 1A and 1B.

First, as shown in FIG. 1A, a silicon oxide film 11 and a silicon nitride film 12 are formed, in order, on the semiconductor substrate 10. The silicon oxide film 11 and the silicon nitride film 12 are patterned so as to form an opening having a predetermined size. The etching process is accomplished by using the patterned silicon oxide film 11 and silicon nitride film 12 as a mask so that the semiconductor substrate 10 forming a trench groove, only directly under the opening region of the silicon oxide film 11 and the silicon nitride film 12, is removed. As a result of these steps, a trench groove having predetermined size is formed in the semiconductor substrate 10. The trench groove surface is etched to remove defects, and a silicon oxide film 13 is formed so as to cover the entire surface of the inner walls of the trench groove. The silicon oxide film 13 is provided as a protection film to remove the defect of surface and to obtain a fine deposition of the device separation film.

As shown in FIG. 1B, sequentially, an oxide film 14a and 14b are deposited on the silicon oxide film 13 covering the inner wall surface of the trench groove so that the trench groove is completely filled with the oxide film. The oxide film 14a and 14b are etched back on the entire surface so as to obtain a device isolation region of trench type.

However, a device separation film having a fixed thickness can be obtained in the narrow trench region by this method, but the surface of the semiconductor substrate in the wide trench region is exposed.

Another conventional method illustrated in FIG. 2 is adapted to solve the above mentioned problem that the surface of the semiconductor substrate is exposed due to entire surface etching. Another conventional method will be now described in conjunction with FIG. 2.

First, a silicon oxide film 21 and a silicon nitride film 22 are formed, in order, on the semiconductor substrate 20. The silicon oxide film 21 and the silicon nitride film 22 are patterned so as to form an opening having a predetermined size. The etching process is accomplished by using the patterned silicon oxide film 11 and the silicon nitride film 22 as a mask so that the semiconductor substrate 20 forming a trench groove is removed only directly under the opening region of the silicon oxide film 21 and the silicon nitride film 22. As a result of these steps, a trench groove having predetermined size is formed in the semiconductor substrate 20. The trench groove surface is etched to remove defects, and a silicon oxide film 23 is formed so as to cover the entire surface of the inner walls of the trench groove. The silicon oxide film 23 is provided as a protection oxide film so as to obtain a fine deposition of the device separation film.

Sequentially, an oxide film 24a and 24b are deposited on the silicon oxide film 23 covering the inner wall surface of the trench groove so that the trench groove is completely filled with the oxide film. Further, the oxide film 24a and 24b, except within the trench groove, are unnecessary for the device. Thus, an etch back process is carried out by chemical mechanical polishing (CMP) for the removal of the deposited oxide film, except within the trench groove. By such etch back process, the oxide film is removed so as to remain the oxide film 24a and 24b within the trench groove only. Therefore, a device isolation region of trench type can be obtained.

However, this method also has the problem of dishing in a relatively wide trench. The dishing may decrease the reliability of the semiconductor device due to the thickness decrease of the device isolation film.

SUMMARY OF THE INVENTION

Therefore, an object of the present invention is to solve the above-mention problems encountered in the prior arts and to provide a method of forming a device isolation film capable of avoiding an occurrence of exposing and dishing in a wide trench region.

In accordance with one aspect, the present invention provides a method of manufacturing a semiconductor device comprising the steps of forming a device isolation film on a main surface of a semiconductor substrate: forming a first oxidation prevention film on the main surface of a semiconductor substrate, sequentially etching respective predetermined portions of said first oxidation prevention film to form a device isolation region; etching said semiconductor substrate to form a trench groove by using the patterned said first oxidation prevention film as a mask, and etching the trench groove surface to remove a defects; forming a second oxidation prevention film on the entire surface of the semiconductor substrate, and pattering said second oxidation prevention film; forming a first device separation film on the entire exposed surface of said semiconductor substrate; etching said second oxidation prevention film; depositing an oxide film to form a second device isolation region on the trench groove surface; and etching the oxide film except within the trench groove.

In accordance with another aspect, the present invention provides a method for manufacturing a semiconductor device comprising the steps of forming a device isolation film on the main surface of a semiconductor substrate: forming a first oxidation prevention film on a main surface of a semiconductor substrate, sequentially etching respective predetermined portions of said first oxidation prevention film to form a device isolation region; etching said semiconductor substrate to form a trench groove by using the patterned said first oxidation prevention film as a mask, and etching the trench groove surface to remove defects; forming a second oxidation prevention film on the entire surface of the semiconductor substrate, and pattering said second oxidation prevention film; forming a first device isolation film by the thermal oxidation process on the entire exposed surface of said semiconductor substrate; etching said second oxidation prevention film; depositing a CVD oxide film to form a second device isolation region on the trench groove; and forming a second device separation film by the etching process.

BRIEF DESCRIPTION OF THE DRAWINGS

Other objects and aspects of the present invent-on will become apparent from the following description of embodiments with reference to the accompanying drawings in which.

DETAILED DESCRIPTION OF THE PREFERRED EMBODIMENTS

The embodiments of the present invention will be explained with reference to the drawings.

FIGS. 3A to 3D are schematic sectional views showing a method of forming an isolation region involved in a semiconductor device in accordance with an embodiment of the present invention.

Figure 1A:
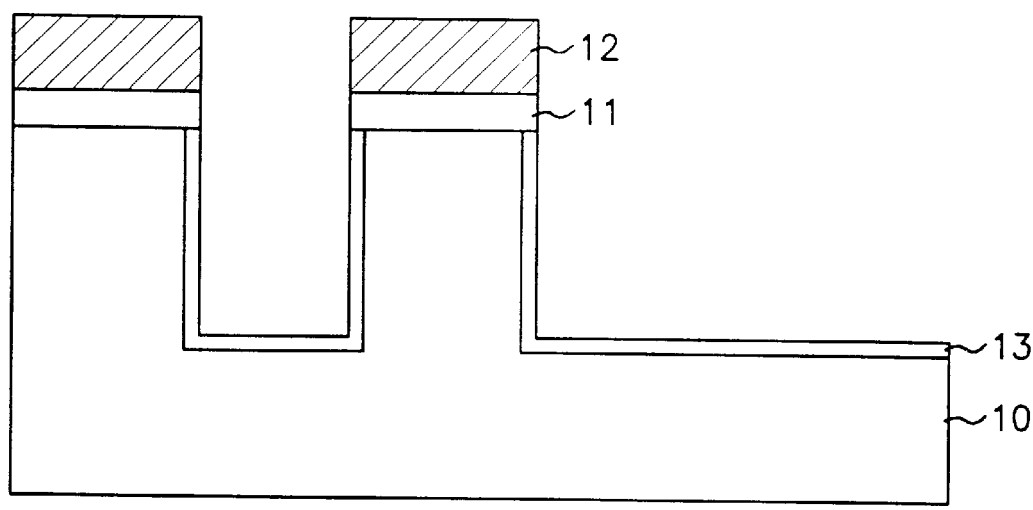
FIGS. 1A and 1B are schematic sectional views showing conventional method of manufacturing a semiconductor device including device isolation region to trench type.
Figure 1B:
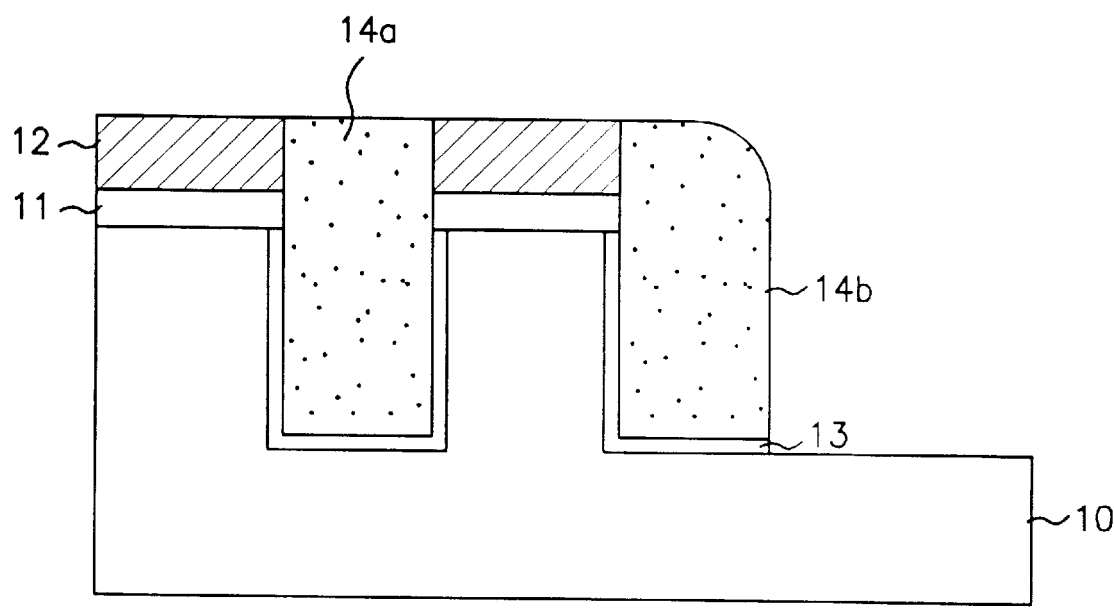
Figure 2:
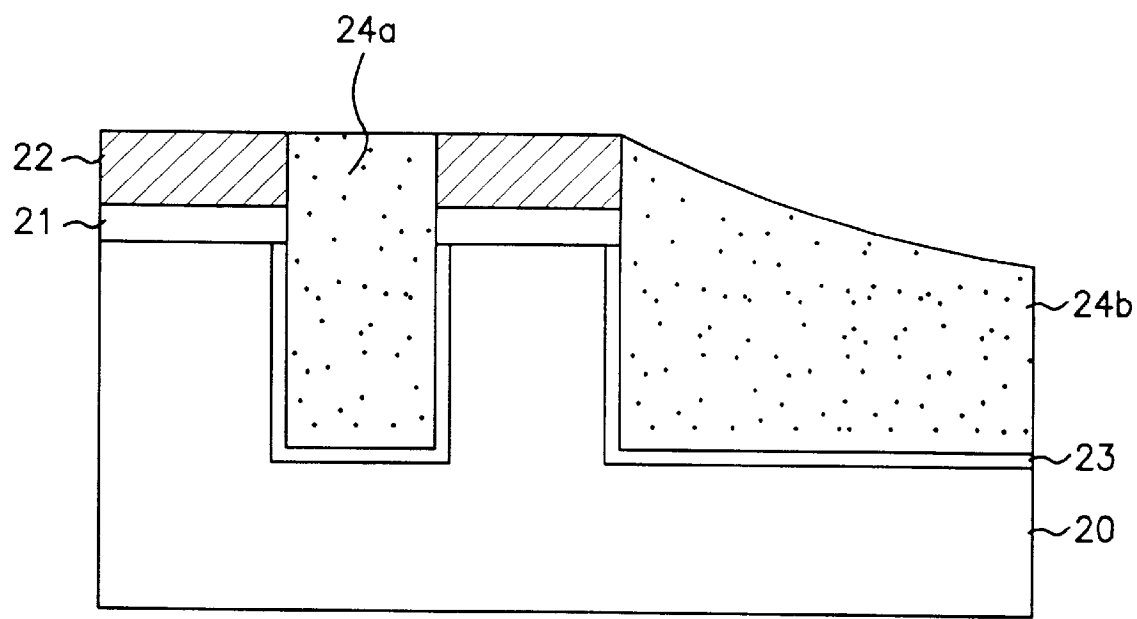
FIG. 2 is a schematic sectional view showing another conventional method of manufacturing a semiconductor device including a device isolation region to trench type.
Figure 3A:
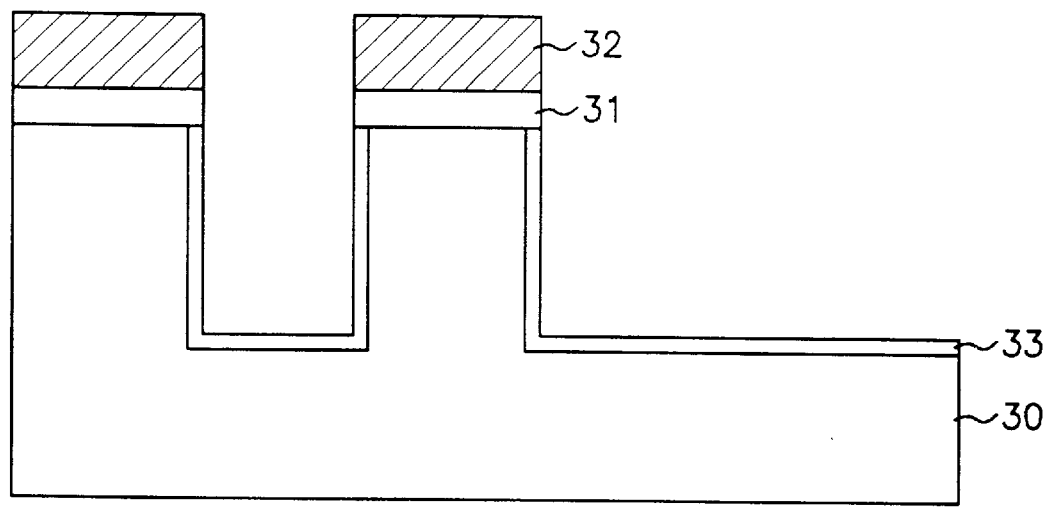
FIGS. 3A to 3D schematic sectional views showing a method of forming an isolation region involved in a semiconductor device in accordance with an embodiment of the present invention.

As shown in FIG. 3A, a pad oxide film 31 is formed on a semiconductor substrate 30 of P type having a face orientation (100), and a first nitride film 32 is deposited on the pad oxide film 31. The first nitride film 32 and the pad oxide film 31 are sequentially etched at their selected portions having a predetermined size for defining a trench groove. The semiconductor substrate 30 is etched by a reaction ion etching (RIE), which is anisotropic etching, and a trench groove having a predetermined size is formed in the semiconductor substrate 30. The trench groove surface is etched to remove defects, and a prevention oxide film 33 is grown so as to cover the entire surface of the inner walls of the trench groove.

Figure 3B:
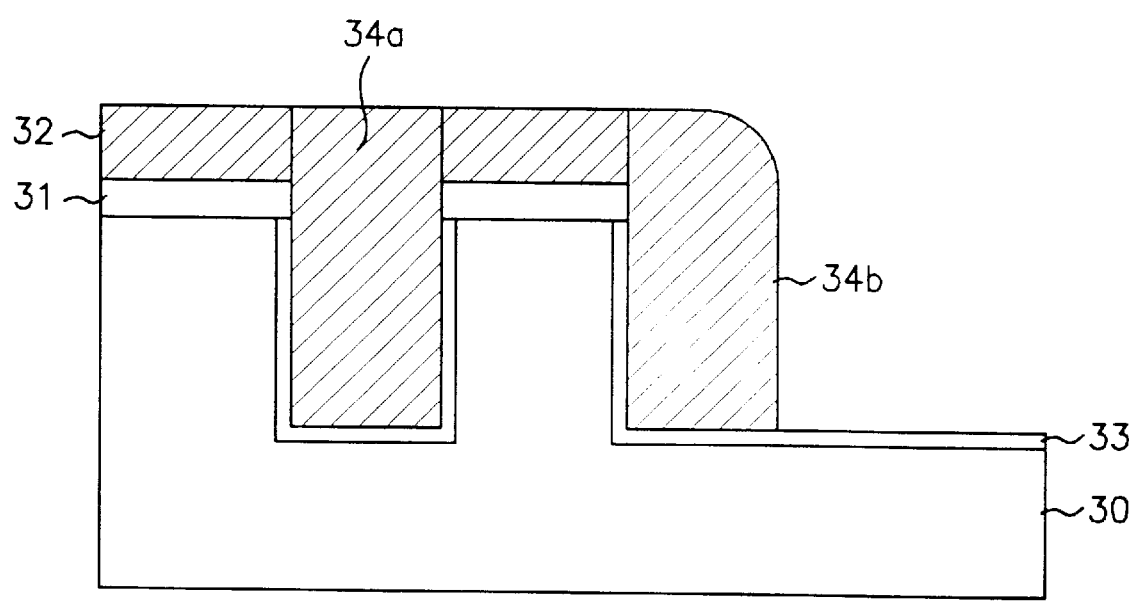
Figure 3C:
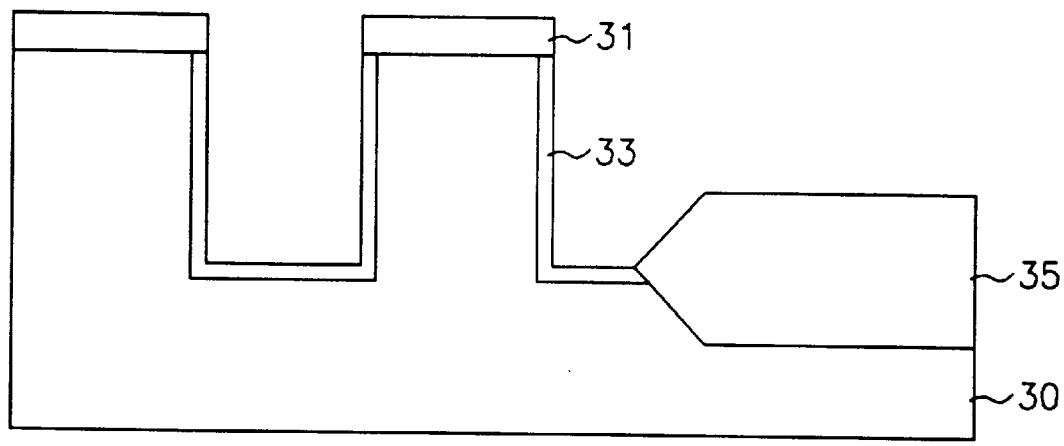

As shown in FIG. 3B, second nitride films 34a and 34b are deposited on the entire surface of the semiconductor substrate 30, and the second nitride films 34a and 34b are etched back by an anisotropic etching. Here, the narrow and wide device isolation regions are formed by the second nitrite film 34a and the second nitride spacer 34b, respectively.

As shown in FIG. 3, a first device separation film 35 on the entire exposed surface of the wide device isolation region is grown by a thermal oxidation process, and the first nitride film 32 and the second nitride films 34a and 34b are subsequently removed.

Figure 3D:
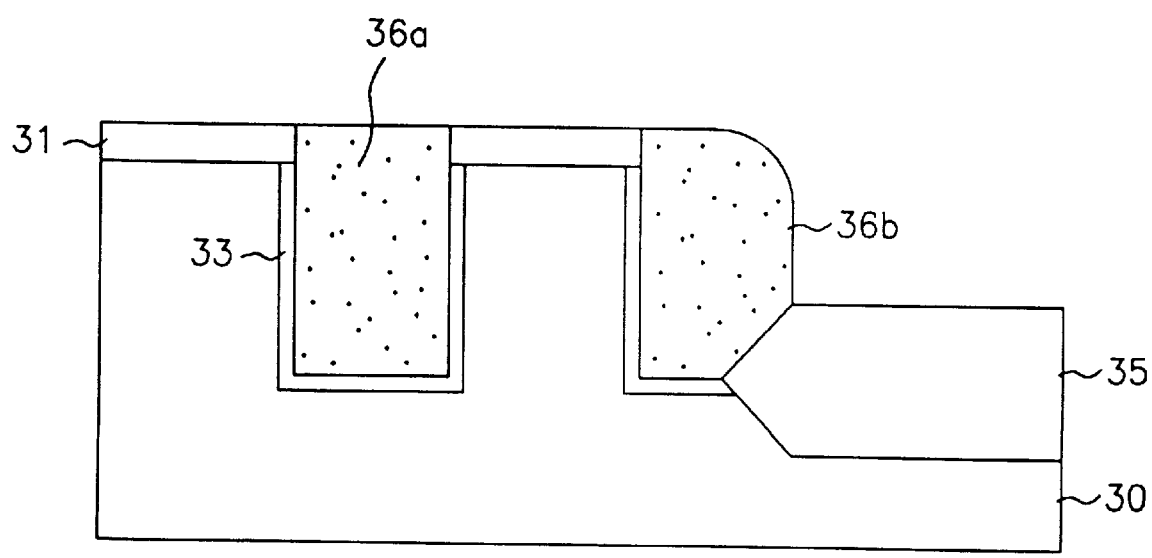

As shown in FIG. 3D, second device separation films 36a and 36b on the entire surface are deposited by a CVD oxidation process on the prevention oxide film 33 covering the inner wall surface of the trench groove so that the trench groove is completely filled with the oxide film. Further, the second device separation films 36a and 36b, except within the trench groove, are unnecessary for the device. Thus, an etch back process is carried for the removal of the deposited oxide film, except within the trench groove. By such etch back process, the second device isolation film is removed so as to have the second device isolation films 36a and 36b remain within the trench groove only. Here, the narrow and the wide device isolation regions are formed by second device separation films 36a and 36b, respectively.

A second embodiment of the present invention will be explained with reference to the drawings.

Figure 4:
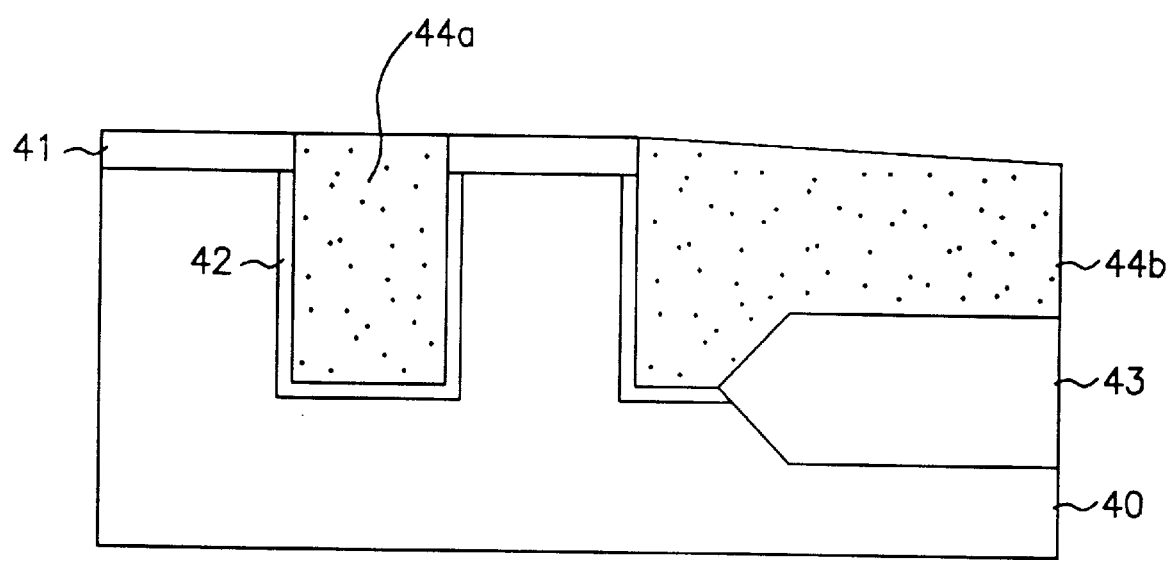
FIG. 4 is a schematic sectional views showing a method of forming an isolation region involved in a semiconductor device in accordance with another embodiment of the present invention.

FIG. 4 is a schematic sectional view showing a method of forming an isolation region involved in a semiconductor device in accordance with another embodiment of the present invention.

As shown in FIG. 4, a pad oxide film 41 is formed on a semiconductor substrate 40 of P type having a face orientation (100), and a first nitride film is deposited on the pad oxide film 41. The first nitride film and the pad oxide film 41 are sequentially etched at their selected portions having a predetermined size for defining a trench groove. The semiconductor substrate 40 is etched by an RIE, which is anisotropic etching, and a trench groove having a predetermined size is formed in the semiconductor substrate 40. The trench groove surface is etched to remove defects, and a prevention oxide film 42 is grown so as to cover the entire surface of the inner wall of the trench groove. A second nitride film is deposited on the entire surface of the semiconductor substrate 40, and the second nitride film is etched back by an anisotropic etching.

A first device separation film 45 on the entire exposed surface of the wide device separation region is grown by a thermal oxidation process, and the first nitride film and second nitride film are subsequently removed.

A second device separation film 44a and 44b on the entire surface are deposited by a CVD oxidation process on the prevention oxide film 42 covering the inner wall surface of the trench groove so that the trench groove is completely filled with the oxide film. Further, second device separation films 44a and 44b, except within the trench grooves are unnecessary for the device. Thus, an etch back process is carried by using CMP for a removal of the deposited oxide film, except within the trench groove. By such etch back process, the second device separation film is removed so as to have second device isolation films 44a and 44b remain within the trench groove only. Here, the narrow device separation region is formed by the second device isolation film 44a. The second device isolation film is formed by a CVD oxidation process. The wide device isolation region formed by second device isolation film 44a and 44b is sequentially formed by the thermal and the CVD oxidation process.

Additional advantages and modifications will readily occur to those skilled in the art. Therefore, the invention in its broader aspects is not limited to the specific details and illustrated examples shown and described herein. Accordingly, various modifications may be made without departing from the spirit or scope of the general inventive concept as defined by the appended claims ard their equivalents.

What is claimed is:

1. A method of fabricating a semiconductor device having a narrow isolation region and a wide isolation region on a semiconductor substrate, comprising the steps of:

forming a trench mask pattern on said semiconductor substrate using anti-oxidation material;

forming a first trench and a second trench in said narrow isolation region and said wide isolation region respectively, wherein the first trench and the second trench are formed using said trench mask pattern and forming a nitride film on the whole structure formed on said semiconductor substrate;

executing a blanket etching of said nitride film, thereby said nitride film is left in the first trench and side wall portion of the second trench;

forming a first oxide film in the second trench by thermal oxidation of said semiconductor substrate;

removing said trench mask pattern and said nitride film and forming a second oxide film on the whole structure formed on said semiconductor substrate; and etching back the second oxide film, thereby the first trench is buried with the second oxide film and side wall portion of the second trench is covered with the second oxide film.

2. The method defined in claim 1, wherein the trench mask pattern is composed of a pad oxide film and a nitride film sequentially stacked.

3. The method defined in claim 1, wherein the second oxide film is deposited by chemical vapor deposition (CVD) method.

4. The method defined in claim 1, wherein the step of etching back the second oxide film is carried out by using blanket dry etching method.

5. The method defined in claim 1, wherein the step of etching back the second oxide film is carried out by chemical mechanical polishing (CMP) method.

* * * * *